United States Patent
Gergintschew

(10) Patent No.: US 6,747,505 B1
(45) Date of Patent: Jun. 8, 2004

(54) CIRCUIT CONFIGURATION FOR CONTROLLING A LOAD WITH REDUCED NOISE EMISSION

(75) Inventor: Zenko Gergintschew, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/667,278

(22) Filed: Sep. 22, 2000

(30) Foreign Application Priority Data

Sep. 22, 1999 (DE) .......................... 199 45 432

(51) Int. Cl.⁷ ............................................. H03K 17/687
(52) U.S. Cl. ...................................... 327/404; 327/427
(58) Field of Search ................................. 327/379, 427, 327/384, 378, 386, 365

(56) References Cited

U.S. PATENT DOCUMENTS

| | | | |
|---|---|---|---|
| 4,962,482 A | * 10/1990 | Jinbo | 365/207 |
| 5,398,318 A | 3/1995 | Hiraishi et al. | 326/82 |
| 5,646,516 A | * 7/1997 | Tobita | 327/313 |
| 5,747,854 A | * 5/1998 | Gotou | 257/368 |
| 5,903,422 A | * 5/1999 | Hosokawa | 327/543 |
| 6,064,264 A | * 5/2000 | Tarsia et al. | 330/277 |

FOREIGN PATENT DOCUMENTS

| | | |
|---|---|---|
| EP | 0 332 301 A2 | 9/1989 |
| EP | 0 347 998 A1 | 12/1989 |
| EP | 0 688 077 | 12/1995 |

* cited by examiner

Primary Examiner—Dinh T. Le
(74) Attorney, Agent, or Firm—Laurence A. Greenberg; Werner H. Stemer; Ralph E. Locher

(57) ABSTRACT

A circuit configuration for controlling a load with reduced noise emission is proposed. The circuit contains a switching device that is connected in series with the load between two supply potential terminals. A control device controls the switching device. The switching device contains a first and at least one second semiconductor switch, whose load paths are connected in parallel fashion with the first semiconductor switch. The threshold voltage of the first semiconductor switch is higher than that of the second semiconductor switch.

5 Claims, 2 Drawing Sheets

CIRCUIT CONFIGURATION FOR CONTROLLING A LOAD WITH REDUCED NOISE EMISSION

BACKGROUND OF THE INVENTION

Field of the Invention

The invention relates to a circuit configuration for controlling a load with reduced noise emission. The circuit configuration has a switching device that is connected in series with the load between two supply potential terminals and a control device that actuates the switching device.

Circuit configurations of this type are commonly controlled in a pulse-width modulated manner in order to achieve current regulation in a load path. However, the pulse-shaped current consumption leads to undesirable noise emissions. In particular, the noise emissions can be disruptive to the functions of neighboring circuit configurations. The noise emission (EMV-noise) is mainly produced when the switching device that is connected in series with the load is switched completely on or completely off. The EMV disturbances are caused specifically by those regions of the current characteristics that contain a particularly abrupt relative decrease or increase of the current flow. During the rising edge operation, the current increase from zero to a value other than zero is considered particularly critical. However, the disrupting radiation is prevented when the current characteristic assumes a sinusoidal course. Given pulse-width modulation, the noise spectrum is determined by the shape of rising and falling edges. In particular, the amount of noise emitted is determined by the edge steepness of the current characteristic. The flatter the edge steepness, the less noise emission. But a flat current edge has the disadvantageous result that it drastically elevates the switching losses. Therefore, to prevent switching losses and thus a thermal heating of the semiconductor switch, it is expedient to configure the current edges as steep as possible on both the leading and trailing sides. On the other hand, this causes the electromagnetic noise emission to increase.

When MOS switches are used as semiconductor switches, the lower corners of the rising and falling edges are particularly critical with respect to noise emission.

For these reasons, efforts have been made to find an optimal compromise between the power loss of the semiconductor switch and the generated noise radiation. In the prior art, it is proposed that this object is achieved by performing a control or regulation of the gate voltage of the power transistor. Besides a complicated control circuit, the proposed solution has the disadvantage that only the falling edge is affected; that is, it is rounded off. In addition, a higher circuitry outlay is required for the control circuit, which requires additional space in an integrated circuit configuration and is thus expensive, and which still causes EMV disturbances during the rising edge.

SUMMARY OF THE INVENTION

It is accordingly an object of the invention to provide a circuit configuration for controlling a load with reduced noise emission which overcomes the above-mentioned disadvantages of the prior art devices of this general type, which configuration causes significantly less noise.

With the foregoing and other objects in view there is provided, in accordance with the invention, a circuit configuration for controlling a load and producing reduced noise emissions. The circuit configuration contains two supply potential terminals including a first supply potential terminal and a second supply potential terminal. A switching device is provided for connecting in series with the load between the two supply potential terminals. The switching device contains semiconductor switches including a first semiconductor switch and a second semiconductor switch. The semiconductor switches have load paths connected in parallel and each of the semiconductor switches has a threshold voltage. The threshold voltage of the first semiconductor switch is higher than the threshold voltage of the second semiconductor switch. A control device is connected to and controls the switching device.

In accordance with an added feature of the invention, the semiconductor switches are field-effect-controlled components.

The invention is based on the recognition that the noise emission that is caused by a semiconductor switch can be reduced by rounding off the rising and falling edges of the current characteristic. This is achieved in that the switching device contains a first and at least one second semiconductor switch, whose load paths are connected in parallel, the threshold voltage of the first semiconductor switch being larger than that of the second semiconductor switch. The threshold voltages of the semiconductor switches can be defined either by differences in the doping of their bulk regions or by different thicknesses of their gate oxides.

During a rising edge, the second semiconductor switch with the lower threshold voltage thus starts to conduct current even when given smaller control voltages by the control device. Therefore, this semiconductor starts to conduct current sooner. A short time later, the first semiconductor switch, which has the higher threshold voltage, also conducts. In a corresponding manner, during the falling edge the second semiconductor switch (having the smaller threshold voltage) remains conductive longer than the first semiconductor switch. Due to the superimposing of the currents of the first and second semiconductor switches, the lower corners of the switching edges in the rising and falling processes are rounded off. As a result, fewer harmonic components arise in the noise spectrum.

In an advantageous development, the control terminals of the first and second semiconductor switches are connected to one another. The result of this is that all three terminals—the control terminal and the two main terminals—of the first and second semiconductor switches are connected to one another. The switching device is thus actuated via a single actuation by the control device. The different switching behaviors—that is, the instants of the conducting and non-conducting of the respective semiconductor circuit—are thus determined exclusively by the threshold voltages of the first and second semiconductor switches.

It is also advantageous to equip the first semiconductor switch with a larger number of cells than the second semiconductor switch. The number of cells of the second semiconductor switch preferably amounts to between two and five percent of the number of cells of the first semiconductor switch.

Alternatively, the first semiconductor switch contains a significantly higher W/L ratio than the second semiconductor switch. W represents the channel width, and L represents the channel length of a field-effect-controlled component.

The inventive circuit configuration can either be constructed in a monolithic integrated fashion or can consist of discrete components. The extremely simple structure of the circuit configuration is suitable for discretely constructed semiconductor components, since these usually do not have separate logic circuits. For this reason, it has been necessary hitherto to provide additional external components in order to influence the edge control, such as components for appropriately controlling or regulating the gate voltage.

The inventive circuit configuration is characterized namely by its extremely simple construction and by the possibility of forgoing any sort of control or regulation. A very economical production is possible, since additional space on the semiconductor chip is not needed given an integrated construction. In most modern integrated technologies, cells having different threshold voltages are available. Thus, manufacturing can be realized using the known production technologies without additional steps or masks. The invention advantageously affects the rising and falling edges of the current characteristic in equal measure. It can be applied in both high-side and low-side configurations.

Other features which are considered as characteristic for the invention are set forth in the appended claims.

Although the invention is illustrated and described herein as embodied in a circuit configuration for controlling a load with reduced noise emission, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
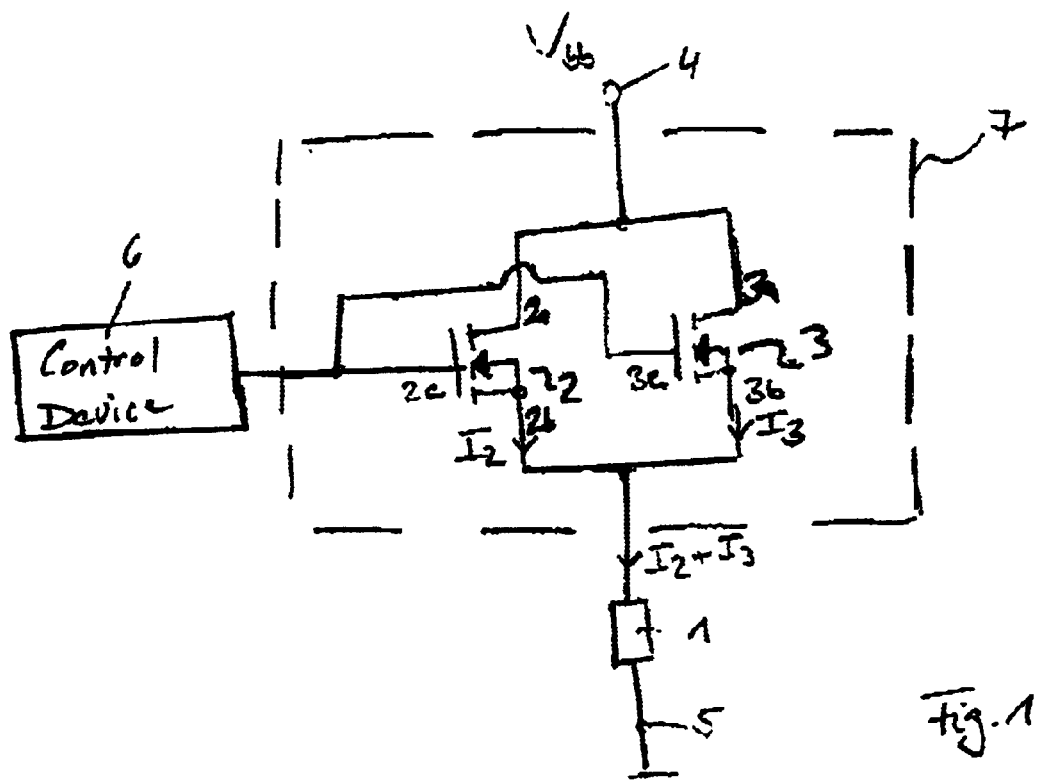
FIG. 1 is a block circuit diagram of a first exemplary embodiment of a circuit configuration being a high-side configuration according to the invention.

In all the figures of the drawing, sub-features and integral parts that correspond to one another bear the same reference symbol in each case. Referring now to the figures of the drawing in detail and first, particularly, to FIG. 1 thereof, there is shown a first exemplifying embodiment of the inventive circuit configuration. The series circuit includes a switching device 7 and a load 1 connected between a first supply potential terminal 4 and a second supply potential terminal 5. A high supply potential $V_{bb}$ is provided at the first supply potential terminal 4, whereas a lower supply potential—for instance a ground potential—is provided at the second supply potential terminal 5. The load 1 can be of a capacitive, inductive, or resistive nature, or a mixture thereof. For example, the load 1 could represent a lamp, a valve, or a motor.

The switching device 7 contains two semiconductor switches 2, 3, which are realized as MOSFETs in the present example. Load paths of the first and second semiconductor switches 2, 3 are connected in a parallel fashion. At a drain side, the first and second semiconductor switches 2, 3 are connected to the first supply potential terminal 4. Source terminals of the first and second semiconductor switches 2, 3 are connected to the load 1. A control device 6 is connected to gate terminals of the two semiconductor switches 2, 3, which device switches the semiconductor switch to conduct or block according to a signal which is fed in from the outside, for example. The gate terminals of the first and second semiconductor switches 2, 3 are consequently connected to each other. The configuring of the control device 6 for a high-side configuration has long been known from the prior art and is not the subject matter of the present invention. A detailed description of the construction will therefore be forgone at this point. The control device 6 could be a charge pump circuit, for example.

The second semiconductor switch 3 inventively has a lower threshold voltage than the first semiconductor switch 2. Furthermore, the second semiconductor switch 3 also has a lower number of cells than the first semiconductor switch 2 or a smaller W/L ratio. W represents a channel width and L a channel length of a MOSFET. When a control signal is received by the control device 6, the second semiconductor switch 3 having the lower threshold voltage already starts to conduct current given small gate voltages. When the voltage at the gate of the two semiconductor switches 2, 3 reaches the threshold voltage of the first semiconductor switch 2, then the second semiconductor switch 3 temporarily delivers a larger current, since the drain-source voltage temporarily rises at the moment when the first semiconductor 2 switch starts conducting. The same applies to the moment the first semiconductor 2 is non-conducting; that is, during the fall of the current edge of the first semiconductor switch 2.

Figure 2:
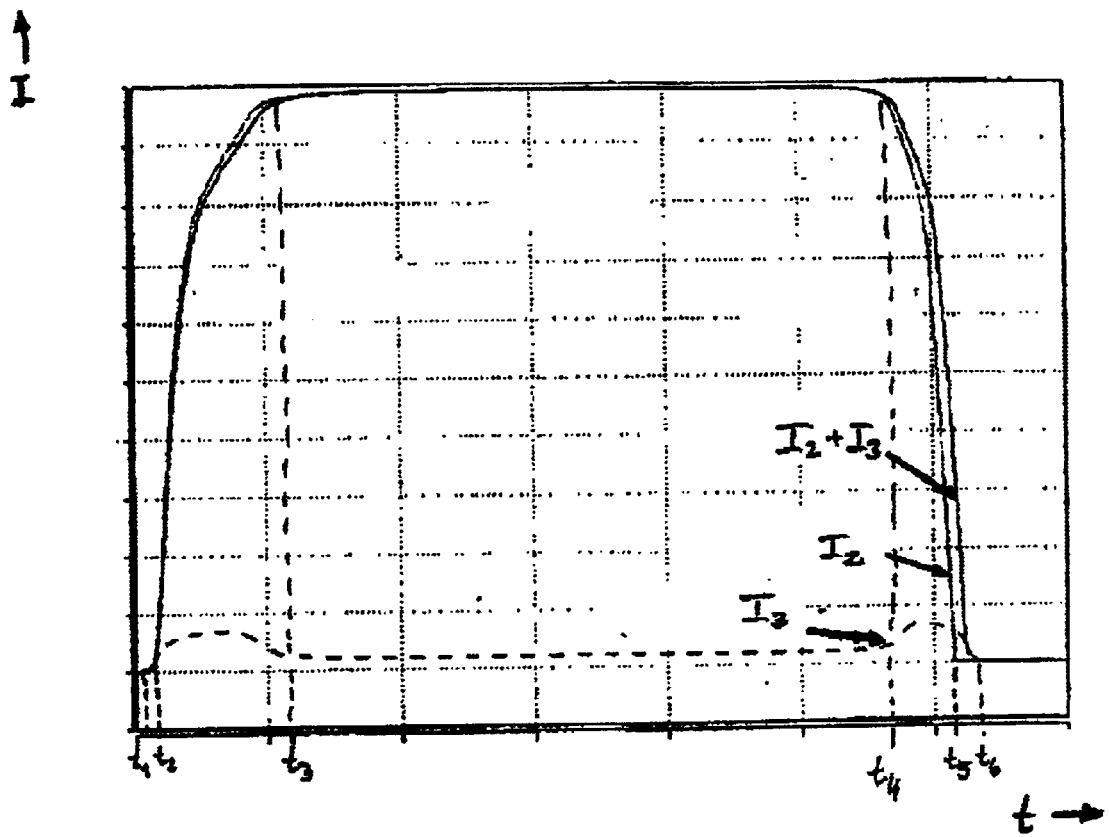
FIG. 2 is a diagram of a current characteristic with rising and falling edges.

FIG. 2 shows a current characteristic through the first and second semiconductor switches 2, 3 during rising and falling edges. $I_3$ references the current through the second semiconductor switch 3; $I_2$ references the current through the first semiconductor switch 2. The sum of the two currents is represented as $I_2+I_3$. At time $t_1$ the gate voltage is provided by the control device 6, which corresponds to the threshold voltage of the second semiconductor switch 3. The second semiconductor switch 3 then begins to conduct. At time $t_2$ the threshold voltage of first semiconductor switch 2 is reached. In a time-span between $t_2$ and $t_1$, the current through the load is essentially determined by the second semiconductor switch 3. The transition from the non-conductive state into the conductive state is defined in this time period by a relatively flat edge for the current rise.

At the time $t_2$, the first semiconductor switch 2 starts to conduct. The first switch 2 is in the position to carry a multiple of the current of the second semiconductor switch 3. This produces a very high rate of current rise. At time $t_3$, the first semiconductor switch 2 is completely on; that is, fully conductive. During the turn-on operation of the first semiconductor switch 2—that is, in the time period between $t_2$ and $t_3$—the drain-source voltage rises sharply. This conditions a larger current flow through the load from the second semiconductor switch 2 due to the physical relations. This has no significant effect on the sum; however, it is responsible for the "rounding" of the rising edge between $t_1$ and $t_2$.

In the turning-off operation, the processes run in reverse. At time $t_4$, the threshold voltage of the first semiconductor switch 2 is reached; that is, the current through the switch is reduced. In turn, this conditions an elevated drain-source voltage, by reason of which the second semiconductor switch 3 delivers an elevated current. At time $t_5$, the first semiconductor switch 2 is completely off, whereas the second semiconductor switch 3 continues to deliver a large current until reaching its threshold voltage at time $t_6$. In this manner, a rounding of the current characteristic is also achieved during the falling edge.

Thus, it is inventively possible to sharply reduce the electromagnetic radiation easily, since this is caused exclusively by the course of the edges in the transitions into the conductive and into the non-conductive states, respectively. Since it is possible to forgo an expensive and complicated control for edge shaping, the inventive circuit configuration can be realized in a rather simple form. The invention is particularly suitable for use in motor vehicles, since the electromagnetic compatibility of the various electrical components plays a large role there. The circuit configuration is equally suitable for supply voltages from 12 V to 14 V, such as are used in motor vehicles. But it is also imaginable to provide supply voltages of 220 V or 380 V, for instance in discrete switches in a three-phase system. Only one switching device is represented in the present exemplifying embodiments in FIG. 1 or FIG. 3. Of course, it is also possible to provide a half-bridge, a full bridge, or a three-phase bridge in which each switching device contains a first and at least one second semiconductor switch in order to reduce the electromagnetic radiation. The invention has the additional advantage that the switching losses remain small, since the rise and decline of the current edges of the first semiconductor switch 2—that is, of the actual power semiconductor switch—can be configured rather steep.

The switching device could also be formed of more than two parallel semiconductor switches. In this case, the threshold voltages and the number of cells, or the W/L ratios, would be different. The greater the number of parallel semiconductor switches, the more selectively the shape of the edges of the current characteristic can be influenced.

Figure 3:
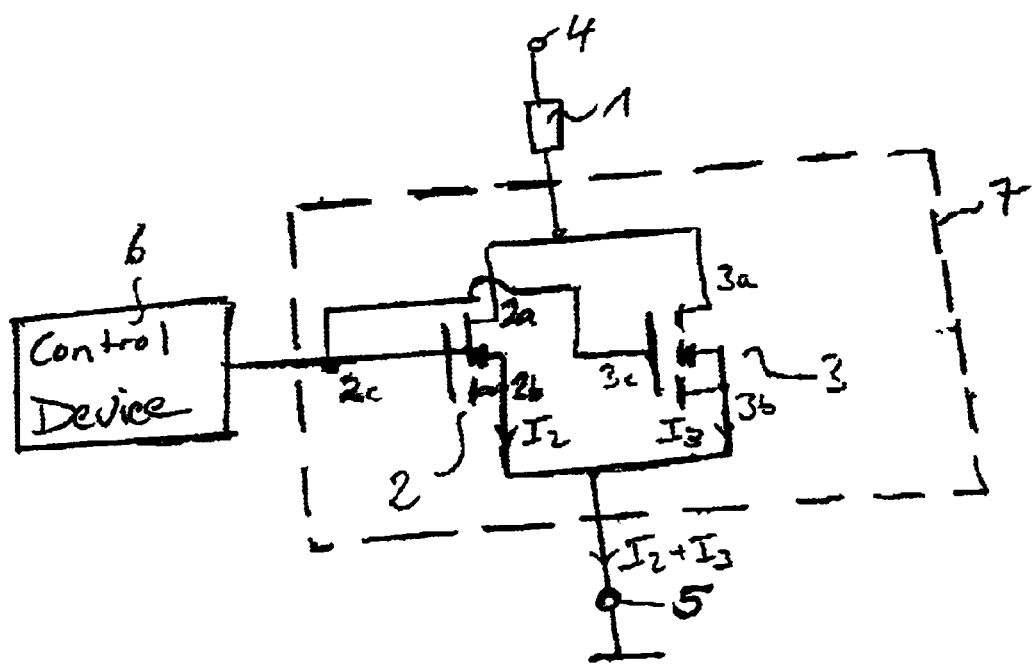
FIG. 3 is a block circuit diagram of a second exemplary embodiment of the invention being low-side configuration.

FIG. 3 shows a further exemplifying embodiment of the invention in a low-side configuration. In this configuration, the load 1 is connected to a high supply potential $V_{bb}$ at the first supply potential terminal 4. The switching device 7, which is constructed as described in FIG. 1, is provided between the other terminal of the load 1 and the second supply potential terminal 5, at which a low reference potential lies.

I claim:

1. A circuit configuration for controlling a load and producing reduced noise emissions, comprising:
   two supply potential terminals including a first supply potential terminal and a second supply potential terminal;
   a switching device for connecting in series with the load between said two supply potential terminals, said switching device containing semiconductor switches including a first semiconductor switch and a second semiconductor switch, said semiconductor switches having load paths connected in parallel and each of said semiconductor switches having a threshold voltage, said threshold voltage of said first semiconductor switch being higher than said threshold voltage of said second semiconductor switch;
   said semiconductor switches being field-effect-controlled components and having cells, said first semiconductor switch having a greater number of said cells than said second semiconductor switch; and
   a control device connected to and controlling said switching device.

2. The circuit configuration according to claim 1, wherein said first semiconductor switch has a control terminal and said second semiconductor switch has a control terminal connected to said control terminal of said first semiconductor switch.

3. The circuit configuration according to claim 1, wherein said first semiconductor switch has a higher W/L ratio than said second semiconductor switch, where W represents a channel width and L represents a channel length.

4. The circuit configuration according to claim 1, wherein said number of said cells of said second semiconductor switch is between 2 and 5 percent of said number of said cells of said first semiconductor switch.

5. The circuit configuration according to claim 1, wherein said semiconductor switches, said control device and said two supply potential terminals are built in one of a monolithically integrated and discrete fashion.

* * * * *